(12) United States Patent
Choi et al.

(10) Patent No.: US 8,922,115 B2
(45) Date of Patent: Dec. 30, 2014

(54) ORGANIC LIGHT EMITTING DIODE DISPLAY AND MANUFACTURING METHOD THEREOF

(71) Applicant: Samsung Display Co., Ltd., Yongin-si (KR)

(72) Inventors: Hae-Yun Choi, Hwaseong-si (KR); Jae-Ik Lim, Hwaseong-si (KR); Min-Woo Kim, Hwaseong-si (KR); Won-Sang Park, Asani-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 13/797,855

(22) Filed: Mar. 12, 2013

(65) Prior Publication Data

US 2014/0097409 A1    Apr. 10, 2014

(30) Foreign Application Priority Data

Oct. 5, 2012 (KR) .................. 10-2012-0110557

(51) Int. Cl.
*H01L 33/00* (2010.01)
*H01L 51/52* (2006.01)

(52) U.S. Cl.
CPC .................... *H01L 51/52* (2013.01)
USPC ....................................... 313/505

(58) Field of Classification Search
CPC ................... H01L 27/3246; H01L 27/3283
USPC .................................... 313/505, 506
See application file for complete search history.

(56) References Cited

U.S. PATENT DOCUMENTS

2005/0179372 A1* 8/2005 Kawakami et al. ........... 313/506

FOREIGN PATENT DOCUMENTS

| KR | 10-2007-0119234 A | 12/2007 |
| KR | 10-2010-0027827 A | 3/2010 |
| KR | 10-2011-0067139 A | 6/2011 |

* cited by examiner

*Primary Examiner* — Thomas L Dickey
(74) *Attorney, Agent, or Firm* — Christie, Parker & Hale, LLP

(57) ABSTRACT

An organic light emitting diode display includes: a substrate, an insulating layer on the substrate; a plurality of pixel electrodes on the insulating layer; a pixel defining layer on the insulating layer overlapping with an end of at least one of the pixel electrodes and defining an emission region and a non-emission region; an organic emission layer on the pixel electrodes; and a common electrode on the organic emission layer, wherein the insulating layer has a plurality of concave portions in the non-emission region adjacent corresponding ones of the pixel electrodes, wherein each of the concave portions has a bottom portion and an inclined portion, and wherein a reflective surface is on at least one of the inclined portions.

20 Claims, 2 Drawing Sheets

ORGANIC LIGHT EMITTING DIODE DISPLAY AND MANUFACTURING METHOD THEREOF

CROSS-REFERENCE TO RELATED APPLICATIONS

This application is based on and claims priority from Korean Patent Application No. 10-2012-0110557, filed on Oct. 5, 2012 in the Korean Intellectual Property Office, the entire disclosure of which is incorporated herein by reference.

FIELD

Embodiments of the present invention relate to an organic light emitting diode display and a manufacturing method thereof, and more particularly, to an organic light emitting diode display with enhanced light efficiency and visibility by differentiating structures for each pixel of red R, green G, and blue B and a manufacturing method thereof.

BACKGROUND

An organic light emitting diode display is a self-emission display device which has one or more organic light emitting diodes that emit light to display an image. Because the organic light emitting diode display does not require a separate light source unlike a liquid crystal display, it is possible to reduce a thickness and a weight of the display device, as compared with a liquid crystal display. Further, because the organic light emitting diode display has high-quality characteristics such as low power consumption, high luminance, and a high response speed, organic light emitting diode displays have received attention as a next-generation display device for portable electronic apparatuses.

In general, an organic light emitting diode includes a hole injection electrode, an organic emission layer, and an electron injection electrode. In the organic light emitting diode, a hole supplied from the hole injection electrode and an electron supplied from the electron injection electrode are coupled with each other in the organic emission layer to form an exciton, and light is generated by energy generated when the exciton falls to a ground state. In the case of the organic light emitting diode, because self efficiency is not high, an internal resonance environment may be made in order to improve efficiency. However, in the internal resonance environment, because a path of light at the front is different, efficiency ratios of red, green, and blue are different from each other, and, as a result, a color difference (WAD) according to angles at the front and the side is generated (e.g., color shifts or brightness changes may appear based on viewing angle). In addition, because a large part of the light emitted from the organic emission layer is guided in a direction parallel to a laminated surface due to total reflection (e.g., total internal reflection) and is lost, light extraction efficiency may be low. Light extraction efficiency is a ratio of a quantity of light extracted from the diode at an observer (or viewing) side to an amount of light emitted from the emission layer, and because the organic light emitting diode has low light extraction efficiency, there is room for improvement with respect to characteristics of the display device such as luminance.

As such, various methods are being developed to improve the light efficiency by efficiently extracting the light generated in the organic emission layer and improving visibility by reducing the color difference (or color or brightness shifts)

SUMMARY

Aspects of embodiments of the present invention are directed to providing an organic light emitting diode display having increased light efficiency by differentiating structures for each pixel of red, green, and blue and improving visibility by reducing a color difference (WAD) according to an angle (e.g., a viewing angle) and a manufacturing method thereof.

An exemplary embodiment of the present invention provides an organic light emitting diode display including: a substrate; an insulating layer on the substrate; a plurality of pixel electrodes on the insulating layer; a pixel defining layer on the insulating layer overlapping with an end of at least one of the pixel electrodes and defining an emission region and a non-emission region; an organic emission layer on the pixel electrodes; and a common electrode on the organic emission layer, wherein the insulating layer has a plurality of concave portions in the non-emission region adjacent corresponding ones of the pixel electrodes, wherein each of the concave portions has a bottom portion and an inclined portion, and wherein a reflective surface is on at least one of the inclined portions.

The pixel electrodes may include a red pixel electrode, a green pixel electrode, and a blue pixel electrode.

The pixel electrodes may further include a white pixel electrode.

The common electrode may be on the pixel defining layer and the insulating layer.

A first reflective surface may be on a first inclined portion at a first concave portion adjacent the red pixel electrode and a second reflective surface may be on a second inclined portion at a second concave portion adjacent the green pixel electrode.

The first and second reflective surfaces may be separated from the common electrode.

The common electrode may be on the first inclined portion and the second inclined portion and form the first and second reflective surfaces.

A third reflective surface may be on a third inclined portion at a third concave portion adjacent the blue pixel electrode and may be spaced from and separate from the common electrode.

The reflective surface may include at least one material selected from the group consisting of Al, Ti, Mg and Ag.

The insulating layer may include a first insulating layer and a second insulating layer on the first insulating layer, wherein the bottom portion may be a surface of the first insulating layer and the inclined portion may be a surface of the second insulating layer.

Further, embodiments of the present invention provide a manufacturing method of the organic light emitting diode display.

Another exemplary embodiment of the present invention provides a method of manufacturing an organic light emitting diode display, including: forming an insulating layer on a substrate; forming a plurality of pixel electrodes on the insulating layer; forming a pixel defining layer on the insulating layer overlapping with an end of at least one of the pixel electrodes; forming an organic emission layer on the pixel electrodes; and forming a common electrode on the organic emission layer, wherein the insulating layer has a plurality of concave portions in a non-emission region adjacent corresponding ones of the pixel electrodes, wherein each of the concave portions has a bottom portion and an inclined portion, and wherein a reflective surface is formed on at least one of the inclined portions.

The forming of the plurality of pixel electrodes may include forming a red pixel electrode, a green pixel electrode, and a blue pixel electrode.

The forming of the plurality of pixel electrodes may further include forming a white pixel electrode.

The common electrode may be on the pixel defining layer and the insulating layer.

A first reflective surface may be on a first inclined portion at a first concave portion adjacent the red pixel electrode and a second reflective surface may be on a second inclined portion at a second concave portion adjacent the green pixel electrode.

The first and second reflective surfaces may be spaced apart from the common electrode.

The common electrode may be on the first inclined portion and the second inclined portion and may form the first and second reflective surfaces.

A third reflective surface is on a third inclined portion at a third concave portion adjacent the blue pixel electrode is spaced from and separate from the common electrode.

The reflective surface may include at least one material selected from the group consisting of Al, Ti, Mg and Ag.

The forming the insulating layer may include forming a first insulating layer, the bottom portion being a surface of the first insulating layer; and forming a second insulating layer on the first insulating layer, the inclined portion being a surface of the second insulating layer.

According to the organic light emitting diode display according to one embodiment of the present invention, by differentially forming a red pixel unit and a green pixel unit in a structure having excellent efficiency and front luminance and a blue pixel unit in a structure having excellent efficiency and side luminance, it is possible to increase light efficiency and improve visibility by reducing the occurrence of a color difference.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
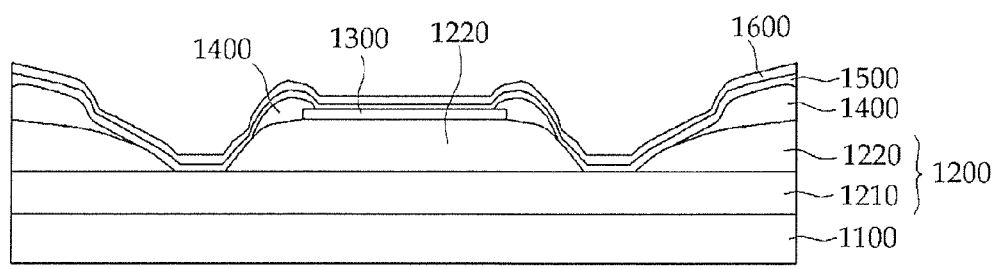
FIG. 1 is a cross-sectional view schematically illustrating structures of a red pixel unit and/or a green pixel unit of an organic light emitting diode display according to a first exemplary embodiment of the present invention.

Hereinafter, exemplary embodiments of the present invention will be described in more detail with reference to the accompanying drawings.

Although embodiments of the present invention can be modified variously and have several embodiments, specific exemplary embodiments are illustrated in the accompanying drawings and will be mainly described in the specification. However, the scope of the present invention is not limited to the specific embodiments and should be construed as including all the changes, equivalents, and substitutions included in the spirit and scope of the present invention.

In this specification, specific structural or functional descriptions are provided to describe exemplary embodiments, and the exemplary embodiments of the present invention can be implemented in various forms. Embodiments of the present invention are not limited to the exemplary embodiments. It should be understood that the present invention contains all changes, equivalents, and substitutions included in the spirit and the scope of the present invention. It will be understood that when an element is referred to as being 'connected to' or 'contacted to' another element without being 'directly connected to' or 'directly contacted to' another element in the present description, it may be 'directly connected to' or 'directly contacted to' another element or be connected to or coupled to another element, having the another element intervening therebetween. Further, when an element is referred to as being 'directly connected to' or 'directly contacted to' another element, no other element is intervening therebetween. Other expressions describing the relationships among the elements, for example, 'between', 'directly between' or 'adjacent to' and 'directly adjacent to' may also be understood similarly.

Terms used in the specification are used to describe illustrative exemplary embodiments and are not to be construed as limiting embodiments of the present invention. Aspects described using a singular expression should be construed as including plural expressions as long as the expressions do not clearly indicate a different contextual meaning. In this specification, terms such as 'comprise', 'include', or 'have' are used to designate presence of implemented features, figures, steps, operations, elements, parts, or combinations thereof and it should be understood that presence or addition possibilities of presence or addition possibilities of other features or figures, steps, operations, elements, parts, or combinations thereof are not excluded in advance. If not differently defined, all terms used herein, which include technical or scientific terms, have meanings in accordance with what would be understood by those skilled in the art. It should be understood that terms defined in advance, which are generally used, have the same meanings as contextual meanings of associated techniques and, if not apparently or explicitly defined in this application, the terms are not defined so as to limit the scope of the meanings of the terms.

Terms used in the specification, such as 'first', 'second', 'third', etc. can be used to describe various elements, but the elements are not to be construed as being limited to the terms. Such terms are merely used to differentiate one element from other elements. For example, the 'first' element may be named the 'second' or 'third' element without departing from the scope of the present invention and similarly, the 'second' or 'third' element may also be similarly alternately named.

Parts which are not associated with the description are omitted in order to concisely describe the present invention and like reference numerals refer to like elements throughout the specification. Further, in the drawings, the size and thickness of each element are arbitrarily illustrated for the sake of convenience of description, and embodiments of the present invention are not limited to those illustrated in the drawings.

In the drawings, the thicknesses of layers and regions are enlarged for clarity. In the drawings, the thicknesses of some layers and regions are exaggerated for the sake of convenience of description.

Figure 2:
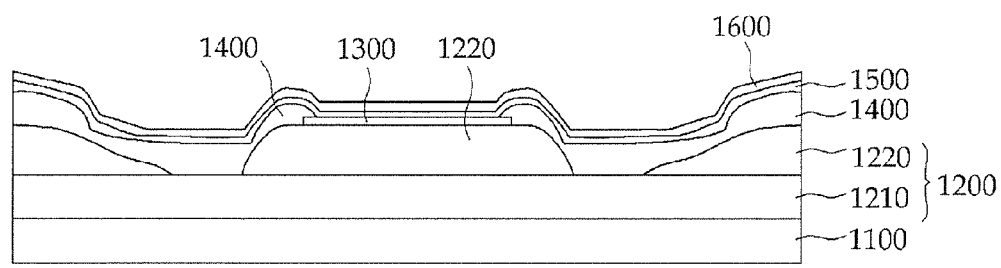
FIG. 2 is a cross-sectional view schematically illustrating a blue pixel unit of the organic light emitting diode display according to the first exemplary embodiment of the present invention.

FIGS. 1 and 2 are cross-sectional views schematically illustrating structures for each type of pixel of an organic light emitting diode display according to a first exemplary embodiment of the present invention.

In more detail, in the organic light emitting diode display according to the first exemplary embodiment of the present invention, structures of a red pixel unit and/or a green pixel unit are illustrated in FIG. 1 and a structure of a blue pixel unit is illustrated in FIG. 2 (e.g., in some embodiments, the structures of the red pixel unit and the green pixel unit are substantially similar when compared with the structure of the blue pixel unit).

First, structures of a red pixel unit and a green pixel unit of an organic light emitting diode display according to the first exemplary embodiment of the present invention will be described with reference to FIG. 1.

The organic light emitting diode display according to the first exemplary embodiment of the present invention includes a substrate 1100, an insulating layer 1200 disposed on the substrate, a pixel electrode 1300 disposed on the insulating layer, a pixel defining layer 1400 formed on the insulating layer overlapping with an end of the pixel electrode and defining an emission region and a non-emission region, an organic emission layer 1500 disposed on the pixel electrode, and a common electrode 1600 disposed on the organic emission layer.

First, the substrate 1100 may be a transparent insulation substrate. For example, the substrate 1100 may be a glass substrate, a quartz substrate, a transparent resin substrate, or the like. Types of transparent resin substrates which may be used as the substrate 1100 may include a polyimide resin, an acrylic resin, a polyacrylate resin, a polycarbonate resin, a polyether resin, a polyethylene terephthalate resin, a sulfonic acid resin, and the like. These materials may be used either alone or in a combination (or combinations) thereof.

A semiconductor device may be formed on the substrate 1100. An example of the semiconductor device is a thin film transistor (TFT) including a gate electrode, a source electrode, and a drain electrode. In the first exemplary embodiment of the present invention described herein, a case where the pixel electrode is a positive electrode is described, and the pixel electrode 1300 as the positive electrode may be electrically connected with the drain electrode of the thin film transistor (TFT). The semiconductor device may be formed by a general method of forming thin film transistors as is well known in the art. Accordingly, the description for a detailed method of forming the semiconductor device or the thin film transistor is omitted herein.

According to one embodiment of the present invention a lower structure including a switching element, a contact, a pad, a plug, an electrode, a conductive pattern, an insulation pattern, or the like may be provided on the substrate. In this case, the lower structure may be disposed at a position which is not overlapped with a main luminescent region on the pixel electrode.

According to the first exemplary embodiment of the present invention, the TFT as the semiconductor device may be formed on the substrate. On the substrate 1100, a gate electrode is formed and a gate insulating layer for insulating the gate electrode is formed. A source electrode and a drain electrode are formed on the gate insulating layer. The gate electrode, the drain electrode, and the source electrode are elements of the TFT, which is referred to as a semiconductor device.

After the source electrode and the drain electrode are formed, the insulating layer 1200 is formed all over the surface of the substrate (e.g., over the entire surface of the substrate). The insulating layer 1200 has a thickness sufficient to cover the lower structures formed on the substrate.

The insulating layer 1200 may be formed as a single-layered structure or may be formed as a multilayered structure including two or more insulating layers.

As illustrated in FIG. 1, the insulating layer 1200 may include a first insulating layer 1210 and a second insulating layer 1220 which are sequentially formed on the substrate 1100. In one embodiment, the first insulating layer 1210 and the second insulating layer 1220 may be formed by using substantially the same or similar material. In other embodiments, the first insulating layer 1210 and the second insulating layer 1220 may be formed by using different materials.

The insulating layer 1200 has a concave portion. The concave portion has a bottom portion and an inclined portion which is an inclined side portion. In more detail, the concave portion is formed by the first insulating layer 1210 and the second insulating layer 1220. In the embodiment shown in FIG. 1, the first insulating layer 1210 forms the bottom portion, and the side portion of the second insulating layer 1220 forms the inclined portion.

According to the first exemplary embodiment of the present invention, in order to improve the degree of planarization of the insulating layer 1200 formed on the substrate, a planarization process may be performed on the substrate. For example, the substrate may have a flat upper surface by applying a chemical mechanical polishing (CMP) process, an etch-back process, or the like onto the substrate.

According to the first exemplary embodiment of the present invention, the insulating layer 1200 may contain an organic material. For example, the insulating layer 1200 may contain a material selected from photoresist, acrylate-based polymers, polyimide-based polymers, polyamide-based polymers, siloxane-based polymers, polymers containing a photosensitive acryl carboxyl group, novolac resins, and alkali developable resins. These materials may be used either alone or in a combination (or combinations) thereof.

In some embodiments of the present invention, the insulating layer 1200 may be formed by using an inorganic material such as a silicon compound, metal, metal oxide, or the like. For example, the insulating layer 1200 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). These materials may be used either alone or in a combination (or combinations) thereof.

The insulating layer 1200 may be formed on the substrate by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, or the like according to a constituent material.

According to one embodiment, the pixel electrode 1300 is formed on the insulating layer 1200. The pixel electrode 1300 may be electrically connected to the drain electrode of the thin film transistor.

According to the first exemplary embodiment of the present invention, the pixel electrode 1300 includes a red R pixel electrode, a green G pixel electrode, and a blue B pixel electrode and may be formed by using a light emitting conductive material. For example, the pixel electrode 1300 may contain at least one of indium tin oxide, indium zinc oxide, zinc tin oxide, zinc oxide, tin oxide, and gallium oxide. These materials may be used either alone or in a combination (or combinations) thereof.

According to the first exemplary embodiment of the present invention, the pixel electrode 1300 may be formed on a part of the insulating layer 1200 by coating a material for the pixel electrode on the entire surface (or substantially the entire surface) of the insulating layer 1200 and then patterning the material for the pixel electrode. Here, the pixel electrode may be formed by a method such as a sputtering process, a vacuum deposition process, a chemical vapor deposition process, a pulse laser deposition process, a printing process, and an atomic layer deposition process using the material for the pixel electrode.

A through-hole which is connected to the semiconductor device, that is, the TFT, through the insulating layer 1200 may be formed in the insulating layer 1200. A part of the semiconductor device is exposed by the through-hole, a contact structure or a pad structure is formed in the through-hole and on the exposed semiconductor element, for example, the thin film transistor (TFT), and the pixel electrode 1300 formed on the insulating layer 1200 may be connected to the contact structure or the pad structure. Accordingly, the pixel electrode 1300 may be electrically connected to the semiconductor device through the contact structure or the pad structure.

Next, the pixel defining layer 1400 is formed on the insulating layer 1200 and the pixel electrode 1300. The pixel defining layer 1400 may be formed by using an organic material, an inorganic material, or the like. For example, the pixel defining layer 1400 may contain a material selected from an organic material such as photoresist, a polyacryl-based resin, a polyimide-based resin, and an acryl-based resin or an inorganic material such as a silicon compound.

A material for forming the pixel defining layer is coated on the pixel electrode 1300 and the entire upper portion of the insulating layer 1200 and then partially etched to form the pixel defining layer 1400 so that a part of the pixel electrode 1300 is exposed. For example, an opening exposing the pixel electrode 1300 may be formed by using a photolithography process or an etching process using an additional etching mask. In this case, a side wall of the opening of the pixel defining layer 1400 may have substantially the same or similar angle of inclination as an angle of inclination of the inclined portion.

According to the first exemplary embodiment of the present invention, the pixel defining layer 1400 may be formed by etching up to (or through to) the top of the first insulating layer 1210 so that the concave portion formed by the first insulating layer 1210 and the second insulating layer 1220 is exposed, as illustrated in FIG. 1.

As the opening is formed in the pixel defining layer 1400, an emission region and a non-emission region of the organic light emitting diode display are defined. Here, a region where the opening of the pixel defining layer 1400 is disposed (or located) corresponds to the emission region, and a region adjacent to the opening corresponds to the non-emission region.

As described above, after the pixel defining layer 1400 is formed, the organic emission layer 1500 is formed on the pixel defining layer 1400 and the pixel electrode 1300.

The organic emission layer 1500 may be formed by using emission materials capable of emitting lights of different colors such as red light, green light, and blue light according to each pixel of the organic light emitting diode display. According to some embodiments, the organic emission layer 1500 may have a multilayered structure which emits white light by laminating a plurality of emission materials capable of emitting lights of different colors such as red light, green light, and blue light. According to other embodiments of the present invention, the organic emission layer 1500 may additionally include a host material having a substantially larger band gap than the emission materials.

According to the first exemplary embodiment of the present invention, the organic emission layer 1500 is located on the pixel electrode 1300. Further, the organic emission layer 1500 extends from the pixel electrode 1300 in the emission region to also be formed above the pixel defining layer 1400 and the insulating layer 1200. That is, as illustrated in FIG. 1, the bottom of the organic emission layer 1500 is located on (e.g., contacts) the pixel electrode 1300, and the side of the organic emission layer 1500 contacts the pixel defining layer 1400 and the insulating layer 1200.

According to some embodiments of the present invention, a first auxiliary emission layer may be formed between the pixel electrode 1300 and the organic emission layer 1500. In this case, the first auxiliary emission layer may include at least one of a hole injection layer and a hole transport layer. Further, a second auxiliary emission layer may be formed between the organic emission layer 1500 and a common electrode 1600. In this case, the second auxiliary emission layer may include at least one of an electron injection layer and an electron transport layer.

Next, the common electrode 1600 is formed on the organic emission layer 1500. The common electrode 1600 may be formed on the organic emission layer 1500 at a regular (e.g., substantially uniform) thickness. The common electrode 1600 may be formed by using a reflective material. For example, the common electrode 1600 may contain a material selected from metal such as aluminum (Al), silver (Ag), platinum (Pt), gold (Au), chromium (Cr), tungsten (W), molybdenum (Mo), titanium (Ti), palladium (Pd), and iridium (Ir), and an alloy (or alloys) thereof. These materials may be used either alone or in a combination (or combinations) thereof.

According to the first exemplary embodiment of the present invention, the common electrode 1600 may be formed all over the surface (e.g., over the entire surface) of the organic emission layer 1500. That is, the common electrode 1600 may be formed to extend onto the pixel defining layer 1400 and the insulating layer 1200.

According to some embodiments of the present invention, the common electrode 1600 may be located only in the emission region. For example, the common electrode 1600 may be disposed on a part of the organic emission layer 1500. In this case, a common electrode layer is formed all over the surface (e.g., over the entire surface) of the organic emission layer 1500 and then patterned to form the common electrode 1600 which is selectively disposed only in the emission region.

According to the first exemplary embodiment of the present invention, as illustrated in FIG. 1, the common electrode 1600 formed to extend to the inclined portion of the insulating layer 1200 which serves as a reflective surface and thus light that would have dissipated due to the total reflection therein (e.g., total internal reflection) are instead reflected to the common electrode 1600 to be discharged toward the substrate, thereby improving light extraction efficiency of the entire surface.

Next, a structure of a blue pixel unit of an organic light emitting diode display according to the first exemplary embodiment of the present invention will be described with reference to FIG. 2.

In the blue pixel unit, constituent elements other than the pixel defining layer 1400 (e.g., the substrate 1100, the insulating layer 1200, the pixel electrode 1300, the organic emission layer 1500, and the common electrode 1600) may be the same as or substantially similar to the structures of the red pixel unit and the green pixel unit described with reference to FIG. 1.

The blue pixel unit of the organic light emitting diode display according to the first exemplary embodiment of the present invention has a structure is which a thickness of the common electrode 1600 is protected from being reduced (e.g., excessively reduced) due to forming the common electrode on a rapid (or steep) inclination. This may be accomplished by performing etching so that the concave portion of the insulating layer 1200 formed by the first insulating layer 1210 and the second insulating layer 1220 is not exposed when the pixel defining layer 1400 is formed (e.g., the pixel defining layer 1400 is not completely etched away in the concave portion of the insulating layer 1200), as illustrated in FIG. 2, thereby reducing the steepness of the incline of the common electrode 1600. Accordingly, in embodiment of the present invention, current non-uniformity due to increase in resistance of the common electrode is reduced or minimized as compared with an organic light emitting diode display in the related art.

Figure 3:
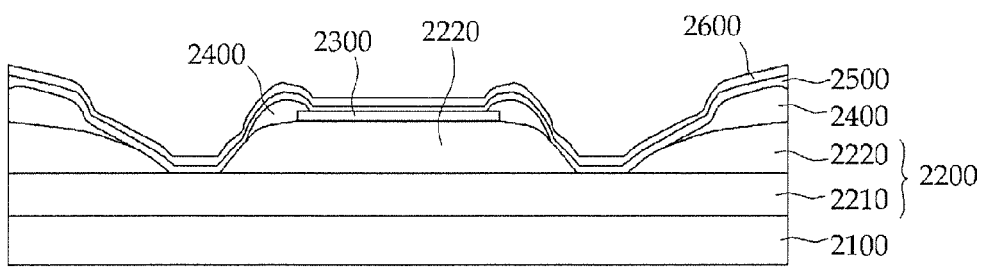
FIG. 3 is a cross-sectional view schematically illustrating structures of a red pixel unit and/or a green pixel unit of an organic light emitting diode display according to a second exemplary embodiment of the present invention.
Figure 4:
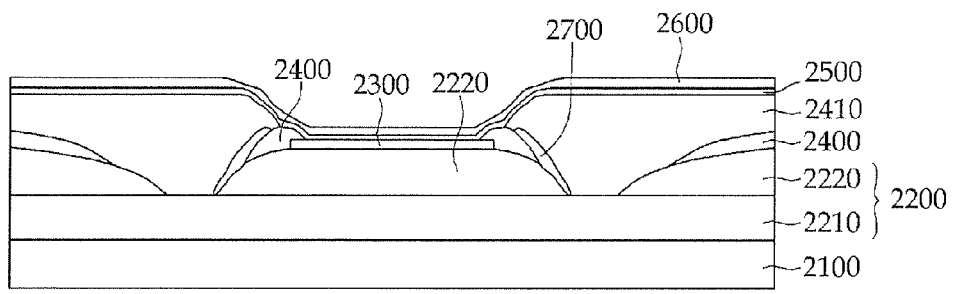
FIG. 4 is a cross-sectional view schematically illustrating a structure of a blue pixel unit of the organic light emitting diode display according to the second exemplary embodiment of the present invention.

FIGS. 3 and 4 are cross-sectional views schematically illustrating structures for each pixel of an organic light emitting diode display according to a second exemplary embodiment of the present invention.

In more detail, in the organic light emitting diode display according to the second exemplary embodiment of the present invention, structures of a red pixel unit and/or a green pixel unit are illustrated in FIG. 3 and a structure of a blue pixel unit is illustrated in FIG. 4.

First, structures of a red pixel unit and/or a green pixel unit of an organic light emitting diode display according to the second exemplary embodiment of the present invention will be described with reference to FIG. 3.

The organic light emitting diode display according to the second exemplary embodiment of the present invention includes a substrate 2100, an insulating layer 2200 disposed on the substrate, a pixel electrode 2300 disposed on the insulating layer, a pixel defining layer 2400 formed on the insulating layer overlapping with an end of the pixel electrode and defining an emission region and a non-emission region, an organic emission layer 2500 disposed on the pixel electrode, and a common electrode 2600 disposed on the organic emission layer.

First, the substrate 2100 may be a transparent insulation substrate. For example, the substrate 2100 may be a glass substrate, a quartz substrate, a transparent resin substrate, or the like. Types of transparent resin substrate which may be used as the substrate 2100 may include a polyimide resin, an acrylic resin, a polyacrylate resin, a polycarbonate resin, a polyether resin, a polyethylene terephthalate resin, a sulfonic acid resin, or the like. These materials may be used either alone or in a combination (or combinations) thereof.

A semiconductor device may be formed on the substrate 2100. An example of the semiconductor device is a thin film transistor (TFT) including a gate electrode, a source electrode, and a drain electrode. In some embodiments of the present invention described herein, a case where the pixel electrode is a positive electrode is described, and the pixel electrode 2300 as the positive electrode may be electrically connected with the drain electrode of the thin film transistor (TFT). The semiconductor device may be formed by a general method of forming thin film transistors as is well known in the art. Accordingly, the description for a detailed method of forming the semiconductor device or the thin film transistor is omitted herein.

According to one embodiment of the present invention a lower structure including a switching element, a contact, a pad, a plug, an electrode, a conductive pattern, an insulation pattern, or the like may be provided on the substrate. In this case, the lower structure may be disposed at a position which is not overlapped with a main emission region on the pixel electrode.

According to the second exemplary embodiment of the present invention, the TFT as the semiconductor device may be formed on the substrate. On the substrate 2100, a gate electrode is formed and a gate insulating layer for insulating the gate electrode is formed. A source electrode and a drain electrode are formed on the gate insulating layer. The gate electrode, the drain electrode, and the source electrode are elements of the TFT, which is referred to as a semiconductor device.

After the source electrode and the drain electrode are formed, the insulating layer 2200 is formed all over the surface of the substrate (e.g., over the entire surface of the substrate). The insulating layer 2200 has a thickness sufficient to cover the lower structures formed on the substrate.

The insulating layer 2200 may be formed as a single-layered structure or may be formed as a multilayered structure including two or more insulating layers.

As illustrated in FIG. 3, the insulating layer 2200 may include a first insulating layer 2210 and a second insulating layer 2220 which are sequentially formed on the substrate 2100. In one embodiment, the first insulating layer 2210 and the second insulating layer 2220 may be formed by using substantially the same or similar material. In other embodiments, the first insulating layer 2210 and the second insulating layer 2220 may be formed by using different materials.

The insulating layer 2200 has a concave portion. The concave portion has a concave bottom portion and an inclined portion which is an inclined side portion. In more detail, the concave portion is formed by the first insulating layer 2210 and the second insulating layer 2220. In the embodiment shown in FIG. 3, the first insulating layer 2210 forms the bottom portion, and the side portion of the second insulating layer 2220 forms the inclined portion.

According to the second exemplary embodiment of the present invention, in order to improve the degree of planarization of the insulating layer 2200 formed on the substrate, a planarization process may be performed on the substrate. For example, the substrate may have a flat upper surface by applying a chemical mechanical polishing (CMP) process, an etch-back process, or the like onto the substrate.

According to the second exemplary embodiment of the present invention, the insulating layer 2200 may contain an organic material. For example, the insulating layer 2200 may contain a material selected from photoresist, acrylate-based polymers, polyimide-based polymers, polyamide-based polymers, siloxane-based polymers, polymers containing a photosensitive acryl carboxyl group, novolac resins, and alkali developable resins. These materials may be used either alone or in a combination (or combinations) thereof.

According to the second exemplary embodiment of the present invention, the insulating layer 2200 may be formed by using an inorganic material such as a silicon compound, metal, and metal oxide. For example, the insulating layer 2200 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). These materials may be used either alone or in a combination (or combinations) thereof.

The insulating layer 2200 may be formed on the substrate by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, or the like in accordance with a constituent material.

According to one embodiment, pixel electrode 2300 is formed on the insulating layer 2200. The pixel electrode 2300 may be electrically connected to the drain electrode of the thin film transistor.

According to the second exemplary embodiment of the present invention, the pixel electrode 2300 includes a red R pixel electrode, a green G pixel electrode, and a blue B pixel electrode and may be formed by using a light emitting conductive material. For example, the pixel electrode 2300 may contain at least one of indium tin oxide, indium zinc oxide, zinc tin oxide, zinc oxide, tin oxide, and gallium oxide. These materials may be used either alone or in a combination (or combinations) thereof.

According to the second exemplary embodiment of the present invention, the pixel electrode 2300 may be formed on a part of the insulating layer 2200 by coating a material for the pixel electrode on the entire surface of the insulating layer 2200 and then patterning the material for the pixel electrode. Here, the pixel electrode may be formed by a method such as a sputtering process, a vacuum deposition process, a chemical vapor deposition process, a pulse laser deposition process, a printing process, and an atomic layer deposition process using the material for the pixel electrode.

A through-hole which is connected to the semiconductor device, that is, the TFT, through the insulating layer 2200 may be formed in the insulating layer 2200. A part of the semiconductor device is exposed by the through-hole, a contact structure or a pad structure is formed in the through-hole and on the exposed semiconductor element, for example, the thin film transistor (TFT), and the pixel electrode 2300 formed on the insulating layer 2200 may be connected to the contact structure or the pad structure. Accordingly, the pixel electrode 2300 may be electrically connected to the semiconductor device through the contact structure or the pad structure.

Next, the pixel defining layer 2400 is formed on the insulating layer 2200 and the pixel electrode 2300. The pixel defining layer 2400 may be formed by using an organic material, an inorganic material, or the like. For example, the pixel defining layer 2400 may contain a material selected from an organic material such as photoresist, a polyacryl-based resin, a polyimide-based resin, and an acryl-based resin or an inorganic material such as a silicon compound.

A material for forming the pixel defining layer is coated on the pixel electrode 2300 and the entire upper portion of the insulating layer 2200 and then partially etched to form the pixel defining layer 2400 so that a part of the pixel electrode 2300 is exposed. For example, an opening exposing the pixel electrode 2300 may be formed by using a photolithography process or an etching process using an additional etching mask. In this case, a side wall of the opening of the pixel defining layer 2400 may have substantially the same or similar angle of inclination as an angle of inclination of the inclined portion.

According to the second exemplary embodiment of the present invention, the pixel defining layer 2400 may be formed by etching up to (or through to) the top of the first insulating layer 2210 so that the concave portion formed by the first insulating layer 2210 and the second insulating layer 2220 is exposed, as illustrated in FIG. 3.

As the opening is formed in the pixel defining layer 2400, the emission region and the non-emission region of the organic light emitting diode display are defined. Here, a region where the opening of the pixel defining layer 2400 is disposed (or located) corresponds to the emission region, and a region adjacent to the opening corresponds to the non-emission region.

As described above, after the pixel defining layer 2400 is formed, the organic emission layer 2500 is formed on the pixel defining layer 2400 and the pixel electrode 2300.

The organic emission layer 2500 may be formed by using emission materials capable of emitting lights of different colors such as red light, green light, and blue light according to each pixel of the organic light emitting diode display. According to the second exemplary embodiment, the organic emission layer 2500 may have a multilayered structure which emits white light by laminating a plurality of emission materials capable of emitting lights of different colors such as red light, green light, and blue light. According to yet the second exemplary embodiment, the organic emission layer 2500 may additionally include a host material having a substantially larger band gap than the emission materials.

According to the second exemplary embodiment of the present invention, the organic emission layer 2500 is located on the pixel electrode 2300. Further, the organic emission layer 2500 extends from the pixel electrode 2300 in the emission region to be also formed above the pixel defining layer 2400 and the insulating layer 2200. That is, as illustrated in FIG. 3, the bottom of the organic emission layer 2500 is located on (e.g., contacts) the pixel electrode 2300, and the side of the organic emission layer 2500 contacts the pixel defining layer 2400 and the insulating layer 2200.

According to the second exemplary embodiment of the present invention, a first auxiliary emission layer may be formed between the pixel electrode 2300 and the organic emission layer 2500. In this case, the first auxiliary emission layer may include at least one of a hole injection layer and a hole transport layer. Further, a second auxiliary emission layer may be formed between the organic emission layer 2500 and a common electrode 2600. In this case, the second auxiliary emission layer may include at least one of an electron injection layer and an electron transport layer.

Next, the common electrode 2600 is formed on the organic emission layer 2500. The common electrode 2600 may be formed on the organic emission layer 2500 at a regular (e.g., substantially uniform) thickness. The common electrode 2600 may be formed by using a reflective material. For example, the common electrode 2600 may contain a material selected from metal such as aluminum (Al), silver (Ag), platinum (Pt), gold (Au), chromium (Cr), tungsten (W), molybdenum (Mo), titanium (Ti), palladium (Pd), and iridium (Ir), and an alloy (or alloys) thereof. These materials may be used either alone or in a combination (or combinations) thereof.

According to the second exemplary embodiment of the present invention, the common electrode 2600 may be formed all over the surface of (e.g., over the entire surface of) the organic emission layer 2500. That is, the common electrode 2600 may be formed to extend onto the pixel defining layer 2400 and the insulating layer 2200.

According to the second exemplary embodiment, the common electrode 2600 may be located only in the emission region. For example, the common electrode 2600 may be disposed on a part of the organic emission layer 2500. In this case, a common electrode layer is formed all over (e.g., over the entire surface of) the surface on the organic emission layer 2500 and then patterned to form the common electrode 2600 which is selectively disposed only in the emission region.

According to the second exemplary embodiment of the present invention, as illustrated in FIG. 3, the common electrode 2600 formed to extend to the inclined portion of the insulating layer 2200 serves as a reflective surface and thus light that would have dissipated due to the total reflection therein (e.g., total internal reflection) are instead reflected to the common electrode 2600 to be discharged toward the substrate, thereby improving light extraction efficiency of the entire surface.

Next, FIG. 4 is a cross-sectional view schematically illustrating a blue pixel unit of the organic light emitting diode display according to the second exemplary embodiment of the present invention.

The blue pixel unit may be the same as or substantially similar to the structures of the red pixel unit and the green pixel unit described with reference to FIG. 3, except that a separate reflective surface 2700 and a spacer 2410 are disposed on the pixel defining layer 2400.

As illustrated in FIG. 4, in the case of the blue pixel unit according to the second exemplary embodiment of the present invention, the separate reflective surface 2700 is formed at the side of the pixel defining layer 2400 corresponding to the inclined portion of the insulating layer 2200 (e.g., the inclined portions of the insulating layer 2200 adjacent the pixel electrode 2300).

Because a material having low conductivity and high reflection can be used as a material for forming the reflective surface 2700, a wide range of materials may be used for the reflective surface 2700. For example, the reflective surface 2700 may contain at least one material selected from the group consisting of Al, Ti, Mg, and Ag.

The spacer 2410 is formed on the reflective surface 2700. The spacer 2410 may extend onto the pixel defining layer 2400 to cover the reflective surface 2700.

In more detail, the reflective surface 2700 is buried between the pixel defining layer 2400 and the spacer 2410. In FIG. 4, an embodiment in which the reflective surface 2700 covers the pixel defining layer 2400 is illustrated, but in other embodiments, the reflective surface 2700 may be formed in any form capable of reflecting light at the side.

Next, the organic emission layer 2500 is formed on the exposed pixel electrode 2300 and the spacer 2410.

According to the second exemplary embodiment of the present invention, the organic emission layer 2500 is located on the pixel electrode 2300. Further, the organic emission layer 2500 extends from the pixel electrode 2300 in the emission region to be also formed above the pixel defining layer 2400 and the spacer 2410. That is, as illustrated in FIG. 4, the bottom of the organic emission layer 2500 is located on (e.g., contacts) the pixel electrode 2300, and the side of the organic emission layer 2500 contacts the pixel defining layer 2400 and the spacer 2410.

Because the reflective surface 2700 is additionally formed on the pixel defining layer 2400 corresponding to the inclined portion of the insulating layer 2200 to mitigate or prevent total reflection (e.g., total internal reflection) of light generated therein, it is possible to reduce or minimize the reduction in the thickness of (e.g., mitigate the thinning of) the common electrode 2600 which is caused by forming the common electrode 2600 on the inclined portion for reflecting light in the organic light emitting diode display in the related art. Therefore, in one embodiment of the organic light emitting diode display according to the present invention, current non-uniformity due to an increase in resistance of the common electrode is reduced or minimized as compared with the organic light emitting diode display in the related art.

Figure 5:
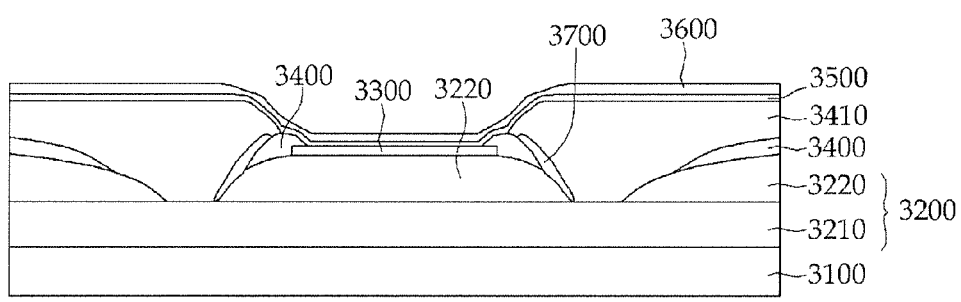
FIG. 5 is a cross-sectional view schematically illustrating structures of a red pixel unit and/or a green pixel unit of an organic light emitting diode display according to yet a third exemplary embodiment of the present invention.
Figure 6:
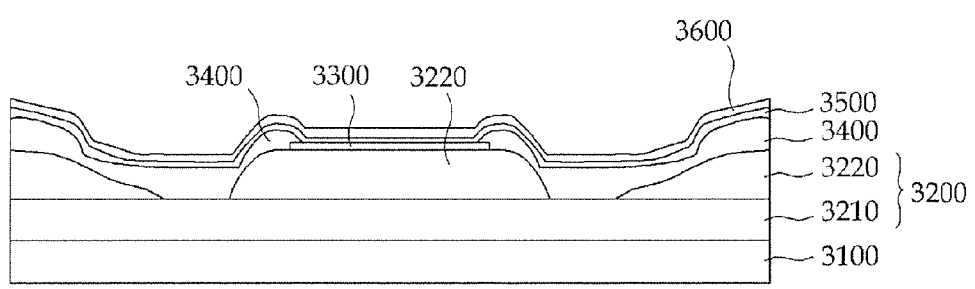
FIG. 6 is a cross-sectional view schematically illustrating a structure of a blue pixel unit of the organic light emitting diode display according to the third exemplary embodiment of the present invention.

FIGS. 5 and 6 are cross-sectional views schematically illustrating structures for each pixel of an organic light emitting diode display according to a third exemplary embodiment of the present invention.

In more detail, in the organic light emitting diode display according to the third exemplary embodiment of the present invention, structures of a red pixel unit and a green pixel unit are illustrated in FIG. 5 and a structure of a blue pixel unit is illustrated in FIG. 6.

First, structures of a red pixel unit and a green pixel unit of an organic light emitting diode display according to the third exemplary embodiment of the present invention will be described with reference to FIG. 5.

The organic light emitting diode display according to the third exemplary embodiment of the present invention includes a substrate 3100, an insulating layer 3200 disposed on the substrate, a pixel electrode 3300 disposed on the insulating layer, a pixel defining layer 3400 formed on the insulating layer overlapping with an end of the pixel electrode and defining an emission region and a non-emission region, an organic emission layer 3500 disposed on the pixel electrode, and a common electrode 3600 disposed on the organic emission layer.

First, the substrate 3100 may be a transparent insulation substrate. For example, the substrate 3100 may be a glass substrate, a quartz substrate, a transparent resin substrate, or the like. Types of transparent resin substrate which may be used as the substrate 3100 may include a polyimide resin, an acrylic resin, a polyacrylate resin, a polycarbonate resin, a polyether resin, a polyethylene terephthalate resin, a sulfonic acid resin, and the like. These materials may be used either alone or in a combination (or combinations) thereof.

A semiconductor device may be formed on the substrate 3100. An example of the semiconductor device is a thin film transistor (TFT) including a gate electrode, a source electrode, and a drain electrode. In the third exemplary embodiments of the present invention described herein, a case where the pixel electrode is a positive electrode is exemplified, and the pixel electrode 3300 as the positive electrode may be electrically connected with the drain electrode of the thin film transistor (TFT). The semiconductor device may be formed by a general method of forming thin film transistors as is well known in the art. Accordingly, the description for a detailed method of forming the semiconductor device or the thin film transistor is omitted herein.

According to one embodiment of the present invention a lower structure including a switching element, a contact, a pad, a plug, an electrode, a conductive pattern, an insulation pattern, or the like may be provided on the substrate. In this case, the lower structure may be disposed at a position which is not overlapped with a main emission region on the pixel electrode.

According to the third exemplary embodiment of the present invention, the TFT as the semiconductor device may be formed on the substrate. On the substrate 3100, a gate electrode is formed and a gate insulating layer for insulating the gate electrode is formed. A source electrode and a drain electrode are formed on the gate insulating layer. The gate electrode, the drain electrode, and the source electrode are elements of the TFT, which is referred to as a semiconductor device.

After the source electrode and the drain electrode are formed, the insulating layer 3200 is formed all over the surface of the substrate (e.g., over the entire surface of the substrate). The insulating layer 3200 has a thickness sufficient to cover the lower structures formed on the substrate.

The insulating layer 3200 may be formed as a single-layered structure or may be formed as a multilayered structure including two or more insulating layers.

As illustrated in FIG. 5, the insulating layer 3200 may include a first insulating layer 3210 and a second insulating layer 3220 which are sequentially formed on the substrate 3100. In one embodiment, the first insulating layer 3210 and the second insulating layer 3220 may be formed by using substantially the same or similar material. In other embodiments, the first insulating layer 3210 and the second insulating layer 3220 may be formed by using different materials.

The insulating layer 3200 has a concave portion. The concave portion has a concave bottom portion and an inclined portion which is an inclined side portion. In more detail, the concave portion is formed by the first insulating layer 3210 and the second insulating layer 3220. In this case, the first insulating layer 3210 forms the bottom portion, and the side portion of the second insulating layer 3220 forms the inclined portion.

According to the third exemplary embodiment of the present invention, in order to improve the degree of planarization of the insulating layer 3200 formed on the substrate, a planarization process may be performed on the substrate. For example, the substrate may have a flat upper surface by applying a chemical mechanical polishing (CMP) process, an etch-back process, or the like onto the substrate.

According to the third exemplary embodiment of the present invention, the insulating layer 3200 may contain an organic material. For example, the insulating layer 3200 may contain a material selected from photoresist, acrylate-based polymers, polyimide-based polymers, polyamide-based polymers, siloxane-based polymers, polymers containing a photosensitive acryl carboxyl group, novolac resins, and alkali developable resins. These materials may be used either alone or in a combination (or combinations) thereof.

According to some embodiments of the present invention, the insulating layer 3200 may be formed by using an inorganic material such as a silicon compound, metal, and metal oxide. For example, the insulating layer 3200 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). These materials may be used either alone or in a combination (or combinations) thereof.

The insulating layer 3200 may be formed on the substrate by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, or the like according to a constituent material.

According to one embodiment, pixel electrode 3300 is formed on the insulating layer 3200. The pixel electrode 3300 may be electrically connected to the drain electrode of the thin film transistor.

According to the some embodiments of the present invention, the pixel electrode 3300 includes a red R pixel electrode, a green G pixel electrode, and a blue B pixel electrode and may be formed by using a light emitting conductive material. For example, the pixel electrode 3300 may contain at least one of indium tin oxide, indium zinc oxide, zinc tin oxide, zinc oxide, tin oxide, and gallium oxide. These materials may be used either alone or in a combination (or combinations) thereof.

According to the third exemplary embodiment of the present invention, the pixel electrode 3300 may be formed on a part of the insulating layer 3200 by coating a material for the pixel electrode on the entire surface of the insulating layer 3200 and then patterning the material for the pixel electrode. Here, the pixel electrode may be formed by a method such as a sputtering process, a vacuum deposition process, a chemical vapor deposition process, a pulse laser deposition process, a printing process, and an atomic layer deposition process using the material for the pixel electrode.

A through-hole which is connected to the semiconductor device, that is, the TFT, through the insulating layer 3200 may be formed in the insulating layer 3200. A part of the semiconductor device is exposed by the through-hole, a contact structure or a pad structure is formed in the through-hole and on the exposed semiconductor element, for example, the thin film transistor (TFT), and the pixel electrode 3300 formed on the insulating layer 3200 may be connected to the contact structure or the pad structure. Accordingly, the pixel electrode 3300 may be electrically connected to the semiconductor device through the contact structure or the pad structure.

Next, the pixel defining layer 3400 is formed on the insulating layer 3200 and the pixel electrode 3300. The pixel defining layer 3400 may be formed by using an organic material, an inorganic material, or the like. For example, the pixel defining layer 3400 may contain a material selected from an organic material such as photoresist, a polyacryl-based resin, a polyimide-based resin, and an acryl-based resin or an inorganic material such as a silicon compound.

A material for forming the pixel defining layer is coated on the pixel electrode 3300 and the entire upper portion of the insulating layer 3200 and then partially etched to form the pixel defining layer 3400 so that a part of the pixel electrode 3300 is exposed. For example, an opening exposing the pixel electrode 3300 is formed by using a photolithography process or an etching process using an additional etching mask. In this case, a side wall of the opening of the pixel defining layer 3400 may have substantially the same or similar angle of inclination as an angle of inclination of the inclined portion.

According to the third exemplary embodiment of the present invention, the pixel defining layer 3400 may be formed by etching up to (or through to) the top of the first insulating layer 3210 so that the concave portion formed by the first insulating layer 3210 and the second insulating layer 3220 is exposed, as illustrated in FIG. 5.

As the opening is formed in the pixel defining layer 3400, the emission region and the non-emission region of the organic light emitting diode display are defined. Here, a region where the opening of the pixel defining layer 3400 is disposed (or located) corresponds to the emission region, and a region adjacent to the opening corresponds to the non-emission region.

As described above, after the pixel defining layer 3400 is formed, a separate reflective surface 3700 is formed at the side of the pixel defining layer 3400, as illustrated in FIG. 5. Because a material having low conductivity and high reflection is used as a material for forming the reflective surface 3700, a selection range of the material is wide. For example, the reflective surface 3700 may contain at least one selected from the group consisting of Al, Ti, Mg, and Ag.

A spacer 3410 is formed on the reflective surface 3700. The spacer 3410 extends onto the pixel defining layer 3400 to cover the reflective surface 3700.

In more detail, the reflective surface 3700 is buried between the pixel defining layer 3400 and the spacer 3410. FIG. 5 depicts an embodiment in which the reflective surface 3700 covers the pixel defining layer 3400, but may be formed in any form capable of reflecting light at the side.

Next, the organic emission layer 3500 is formed on the exposed pixel electrode 3300 and the spacer 3410.

The organic emission layer 3500 may be formed by using emission materials capable of emitting lights of different colors such as red light, green light, and blue light according to each pixel of the organic light emitting diode display. According to some embodiments of the present invention, the organic emission layer 3500 may have a multilayered structure which emits white light by laminating a plurality of emission materials capable of emitting lights of different colors such as red light, green light, and blue light. According to some embodiments of the present invention, the organic emission layer 3500 may additionally include a host material having a substantially larger band gap than the emission materials.

According to the third exemplary embodiment of the present invention, the organic emission layer 3500 is located on the pixel electrode 3300. Further, the organic emission layer 3500 extends from the pixel electrode 3300 in the emission region to be also formed above the pixel defining layer 3400 and the spacer 3410. That is, as illustrated in FIG. 5, the bottom of the organic emission layer 3500 is located on (e.g., contacts) the pixel electrode 3300, and the side of the organic emission layer 3500 contacts the pixel defining layer 3400 and the spacer 3410.

According to the third exemplary embodiment of the present invention, a first auxiliary emission layer may be formed between the pixel electrode 3300 and the organic emission layer 3500. In this case, the first auxiliary emission layer may include at least one of a hole injection layer and a hole transport layer. Further, a second auxiliary emission layer may be formed between the organic emission layer 3500 and a common electrode 3600. In this case, the second auxiliary emission layer may include at least one of an electron injection layer and an electron transport layer.

Next, the common electrode 3600 is formed on the organic emission layer 3500. The common electrode 3600 may be formed on the organic emission layer 3500 at a regular thickness. The common electrode 3600 may be formed by using a reflective material. For example, the common electrode 3600 may contain a material selected from metal such as aluminum (Al), silver (Ag), platinum (Pt), gold (Au), chromium (Cr), tungsten (W), molybdenum (Mo), titanium (Ti), palladium (Pd), and iridium (Ir), and an alloy (or alloys) thereof. These materials may be used either alone or in a combination (or combinations) thereof.

According to the third exemplary embodiment of the present invention, the common electrode 3600 may be formed all over the surface of (e.g., over the entire surface of) the organic emission layer 3500. That is, the common electrode 3600 may be formed to extend onto the pixel defining layer 3400 and the insulating layer 3200.

According to one embodiment, the common electrode 3600 may be located only in the emission region. For example, the common electrode 3600 may be disposed on a part of the organic emission layer 3500. In this case, a common electrode layer is formed all over the surface of (e.g., over the entire surface of) the organic emission layer 3500 and then patterned to form the common electrode 3600 which is selectively disposed only in the emission region.

According to the third exemplary embodiment of the present invention, as illustrated in FIG. 5, the separate reflective surface 3700 is additionally formed on the pixel defining layer 3400 in a region corresponding to the inclined portion of the insulating layer 3200 and thus light dissipating due to the total reflection therein (e.g., total internal reflection) is reflected by the reflective surface 3700 to be discharged toward the substrate, thereby improving light extraction efficiency of the entire surface.

Next, a structure of a blue pixel unit of an organic light emitting diode display according to the third exemplary embodiment of the present invention will be described with reference to FIG. 6.

The structure of the blue pixel unit according to the third exemplary embodiment may be the same as or substantially similar to the structure of the blue pixel unit according to the first exemplary embodiment of the present invention described with reference to FIG. 2.

As illustrated in FIG. 6, the blue pixel unit of the organic light emitting diode display according to the third exemplary embodiment of the present invention has a structure capable of reducing or minimizing a reduction in thickness of (e.g., a thinning of) the common electrode 3600 due to a rapid inclination by performing etching so that the concave portion of the insulating layer 3200 formed by the first insulating layer 3210 and the second insulating layer 3220 is not exposed when the pixel defining layer 3400 is formed, as illustrated in FIG. 2. Accordingly, in one embodiment of the present invention, current non-uniformity due to increase in resistance of the common electrode is reduced or minimized as compared with an organic light emitting diode display in the related art.

As illustrated in FIGS. 1, 3, and 5, the organic light emitting diode displays according to exemplary embodiments of the present invention may be a rear emission type displays in which a display surface is formed on the substrate side, and in this case, the reflective surface is formed on the inclined portion so that a part of the light generated from the emission layer is reflected by the reflective surface to be discharged toward the substrate side.

In more detail, part of the light generated from the emission layer is directly discharged toward the substrate side, but a significant portion of the light is directed within the organic light emitting diode display. Particularly, in an organic light emitting diode display formed in a multilayer structure, an optical waveguide is generally formed, and a significant amount of light moves through the optical waveguide by total reflection (e.g., total internal reflection) and is then then dissipates in the organic light emitting diode display. In embodiments of the present invention, a reflective surface is disposed on a path of the optical waveguide and thus the light moving along the optical waveguide by the total reflection (e.g., total internal reflection) is reflected by the reflective surface to be discharged toward the substrate side.

As such, in order that the reflective surface is disposed on the optical wave-guide, in the exemplary embodiments of the present invention, an inclined portion is formed on the insulating layer and a reflective surface (reflective common electrode or separate reflective surface) is disposed on the inclined portion, and, as a result, the light that would otherwise dissipate due to the total reflection (e.g., total internal reflection) is instead reflected by the reflective surface to be discharged toward the substrate side, thereby improving light extraction efficiency.

Further, as illustrated in FIGS. 2, 4, and 6, the organic light emitting diode display according to exemplary embodiments of the present invention may reduce or minimize the reduction (or thinning) of a thickness of the common electrode caused by forming a portion of the common electrode on the inclined portion for reflection of light in the organic light emitting diode display in the related art. Therefore, in the organic light emitting diode display according to embodiments of the present invention, current non-uniformity due to increase in resistance of the common electrode may be reduced or minimized as compared with the organic light emitting diode display in the related art.

As described above, according to the present invention, a red pixel unit and a green pixel unit have a structure with improved luminance and a blue pixel unit has a structure with improved side luminance to differentially form structures for each pixel of red, green, and blue, and as a result, it is possible to improve visibility due to color differences and light extraction efficiency.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims and equivalents thereof.

What is claimed is:

1. An organic light emitting diode display comprising:
a substrate;
an insulating layer on the substrate;
a plurality of pixel electrodes on the insulating layer;
a pixel defining layer on the insulating layer overlapping with an end of at least one of the pixel electrodes and defining an emission region and a non-emission region;
an organic emission layer on the pixel electrodes; and
a common electrode on the organic emission layer,
wherein the insulating layer has a plurality of concave portions in the non-emission region adjacent corresponding ones of the pixel electrodes,
wherein each of the concave portions has a bottom portion and an inclined portion,
wherein a reflective surface is on at least one of the inclined portions, and
wherein the bottom portion and the at least one of the inclined portions are spaced apart from the pixel electrodes.

2. The organic light emitting diode display of claim 1, wherein the pixel electrodes comprise a red pixel electrode, a green pixel electrode, and a blue pixel electrode.

3. The organic light emitting diode display of claim 2, wherein the pixel electrodes further comprise a white pixel electrode.

4. The organic light emitting diode display of claim 2, wherein a first reflective surface is on a first inclined portion at a first concave portion adjacent the red pixel electrode and a second reflective surface is on a second inclined portion at a second concave portion adjacent the green pixel electrode.

5. The organic light emitting diode display of claim 4, wherein the first and second reflective surfaces are spaced apart from the common electrode.

6. The organic light emitting diode display of claim 4, wherein the common electrode is on the first inclined portion and the second inclined portion and forms the first and second reflective surfaces.

7. The organic light emitting diode display of claim 6, wherein a third reflective surface is on a third inclined portion at a third concave portion adjacent the blue pixel electrode and is spaced from and separate from the common electrode.

8. The organic light emitting diode display of claim 1, wherein the common electrode is on the pixel defining layer and the insulating layer.

9. The organic light emitting diode display of claim 1, wherein the reflective surface comprises at least one material selected from the group consisting of Al, Ti, Mg and Ag.

10. The organic light emitting diode display of claim 1, wherein the insulating layer comprises a first insulating layer and a second insulating layer on the first insulating layer, and
wherein the bottom portion is a surface of the first insulating layer and the inclined portion is a surface of the second insulating layer.

11. A method of manufacturing an organic light emitting diode display comprising:
forming an insulating layer on a substrate;
forming a plurality of pixel electrodes on the insulating layer;
forming a pixel defining layer on the insulating layer overlapping with an end of at least one of the pixel electrodes;
forming an organic emission layer on the pixel electrodes; and
forming a common electrode on the organic emission layer,
wherein the insulating layer has a plurality of concave portions in a non-emission region adjacent corresponding ones of the pixel electrodes,
wherein each of the concave portions has a bottom portion and an inclined portion,
wherein a reflective surface is on at least one of the inclined portions, and
wherein the bottom portion and the at least one of the inclined portions are spaced apart from the pixel electrodes.

12. The method of manufacturing an organic light emitting diode display of claim 11, wherein the forming the plurality of pixel electrodes comprises forming a red pixel electrode, a green pixel electrode, and a blue pixel electrode.

13. The method of manufacturing an organic light emitting diode display of claim 12, wherein
the forming the plurality of pixel electrodes further comprises forming a white pixel electrode.

14. The method of manufacturing an organic light emitting diode display of claim 12, wherein a first reflective surface is on a first inclined portion at a first concave portion adjacent the red pixel electrode and a second reflective surface is on a second inclined portion at a second concave portion adjacent the green pixel electrode.

15. The method of manufacturing an organic light emitting diode display of claim 14, wherein the first and second reflective surfaces are spaced apart from the common electrode.

16. The method of manufacturing an organic light emitting diode display of claim 14, wherein the common electrode is on the first inclined portion and the second inclined portion and forms the first and second reflective surfaces.

17. The method of manufacturing an organic light emitting diode display of claim 16, wherein a third reflective surface is on a third inclined portion at a third concave portion adjacent the blue pixel electrode is spaced from and separate from the common electrode.

18. The method of manufacturing an organic light emitting diode display of claim 11, wherein the common electrode is on the pixel defining layer and the insulating layer.

19. The method of manufacturing an organic light emitting diode display of claim 11, wherein the reflective surface comprises at least one material selected from the group consisting of Al, Ti, Mg and Ag.

20. The method of manufacturing an organic light emitting diode display of claim 11, wherein the forming the insulating layer comprises:
- forming a first insulating layer, the bottom portion being a surface of the first insulating layer; and
- forming a second insulating layer on the first insulating layer, the inclined portion being a surface of the second insulating layer.

* * * * *